(12) United States Patent
Uesugi

(10) Patent No.: US 9,294,075 B2
(45) Date of Patent: Mar. 22, 2016

(54) SEMICONDUCTOR DEVICE

(71) Applicant: SEMICONDUCTOR ENERGY LABORATORY CO., LTD., Atsugi-Shi, Kanagawa-Ken (JP)

(72) Inventor: Wataru Uesugi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 70 days.

(21) Appl. No.: 14/199,561

(22) Filed: Mar. 6, 2014

(65) Prior Publication Data
US 2014/0266367 A1    Sep. 18, 2014

(30) Foreign Application Priority Data

Mar. 14, 2013    (JP) .................................. 2013-051426

(51) Int. Cl.
*H03K 3/356* (2006.01)
*H03K 3/012* (2006.01)

(52) U.S. Cl.
CPC ............ *H03K 3/012* (2013.01); *H03K 3/35606* (2013.01)

(58) Field of Classification Search
CPC ......... H03K 3/012; H03K 3/356; H03K 5/04; G11C 11/24
USPC ................ 327/208, 264, 199–203, 209–218; 365/149; 714/726
See application file for complete search history.

(56) References Cited

U.S. PATENT DOCUMENTS 5,731,856 A    3/1998  Kim et al.
5,744,864 A    4/1998  Cillessen et al.
(Continued)

FOREIGN PATENT DOCUMENTS

EP    1737044 A    12/2006
EP    2226847 A    9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Lincoln Donovan
*Assistant Examiner* — Thomas Skibinski
(74) *Attorney, Agent, or Firm* — Fish & Richardson P.C.

(57) ABSTRACT

To provide a semiconductor device which can perform a scan test and includes a logic circuit capable of reducing signal delay. The semiconductor device includes a combinational circuit, sequential circuits each holding first data supplied to the combinational circuit or second data output from the combinational circuit, first memory circuits each holding first data supplied to the corresponding sequential circuit and holding second data output from the corresponding sequential circuit, and second memory circuits electrically connecting the first memory circuits in series by supplying the first data or second data supplied from one of the first memory circuits to another one of the first memory circuits. The second memory circuit includes a first switch controlling supply of the first data or second data to the node, a capacitor electrically connected to the node, and a second switch controlling output of the first data or second data from the node.

18 Claims, 11 Drawing Sheets

(56) References Cited

U.S. PATENT DOCUMENTS

| | | |
|---|---|---|
| 6,265,922 B1 * | 7/2001 | Kirsch .................... 327/199 |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,269,780 B2 | 9/2007 | Arima et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,314,637 B2 | 11/2012 | Kato et al. |
| 8,362,538 B2 | 1/2013 | Koyama et al. |
| 8,410,838 B2 | 4/2013 | Kato et al. |
| 8,432,187 B2 | 4/2013 | Kato et al. |
| 8,488,394 B2 | 7/2013 | Nagatsuka et al. |
| 8,508,256 B2 | 8/2013 | Yakubo et al. |
| 8,575,985 B2 | 11/2013 | Ohmaru et al. |
| 8,630,130 B2 | 1/2014 | Kurokawa |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0110623 A1 * | 5/2010 | Koyama et al. .......... 361/679.01 |
| 2011/0095800 A1 * | 4/2011 | Ramaraju et al. ............. 327/211 |
| 2012/0250397 A1 | 10/2012 | Ohmaru |
| 2012/0269013 A1 | 10/2012 | Matsuzaki |
| 2012/0287099 A1 | 11/2012 | Toyotaka |
| 2013/0135943 A1 | 5/2013 | Ohmaru |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-295597 A | 10/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO-2004/114391 | 12/2004 |

OTHER PUBLICATIONS

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D at al., "Optical Studies of the Amorphous Liquid-Cholesteric Liquid Crystal Transition:The "Blue Phase"", Physics Letters, Sep. 10, 1973, vol. 45A, No. 2, pp. 115-116.

(56) References Cited

OTHER PUBLICATIONS

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced At Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H at al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", Journal of the SID, 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H at al., "P-29:Modeling of Amorphous Oxide Semiconductor Thin Film Transistors and Subgap Density of States", SID Digest '08: SID International Symposium Digest of Technical Papers, May 20, 2008, vol. 39, pp. 1277-1280.

Ikeda.T at al., "Full-Functional System Liquid Crystal Display Using CG—Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 As a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "Spinel, YbFe2O4, and Yb2Fe3O7 Types of Structures for Compounds in the IN2O3 and Sc2O3—A2O3—BO Systems [A; Fe, Ga, or Al; B: Mg, Mn, Fe, Ni, Cu,or Zn] At Temperatures Over 1000°C", Journal of Solid State Chemistry, 1985, vol. 60, pp. 382-384.

Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y at al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In, Ga; m=Integer) Described by Four-Dimensional Superspace Group", Journal of Solid State Chemistry, 1998, vol. 139, pp. 347-355.

Masuda.S at al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S at al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

(56) References Cited

OTHER PUBLICATIONS

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J at al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J at al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-IN. AMOLED Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous Gizo (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K at al., "Ultra Low Power Consumption Technologies for Mobile TFT-LCDs ", IDW '02 : Proceedings of the 9th International Display Workshops, Dec. 4, 2002, pp. 295-298.

Ueno.K at al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

SEMICONDUCTOR DEVICE

BACKGROUND OF THE INVENTION

1. Field of the Invention

One embodiment of the present invention relates to a semiconductor device. For example, one embodiment of the present invention relates to a semiconductor device including a logic circuit which can perform a scan test.

2. Description of the Related Art

One of methods for verifying whether a manufactured semiconductor device operates correctly is a scan test. In the scan test, a plurality of sequential circuits included in a semiconductor device are connected in series in operation verification so that a shift register called a scan chain is formed, and data for verification is directly input from an external input terminal to the scan chain. Then, a logic circuit is operated in accordance with the input data, and data thus output from the logic circuit is directly extracted from the scan chain through an external output terminal. By the above method, the operation of the logic circuit can be verified.

To carry out the scan test, a plurality of sequential circuits are necessarily connected in series only in operation verification, and therefore a multiplexer is provided on the input side of each of the sequential circuits. By providing multiplexers, connection between the sequential circuits can be changed depending on normal operation or operation verification. Patent Document 1 discloses a memory test circuit which includes an input data register formed of a multiplexer and a scan flip-flop.

REFERENCE

Patent Document

[Patent Document 1] Japanese Published Patent Application No. H6-295597

SUMMARY OF THE INVENTION

In a semiconductor device capable of configuring a scan chain, a circuit size is increased, which leads to an increase in the number of sequential circuits, so that the number of multiplexers is also increased. Since a multiplexer includes a plurality of logic gates, an increase in the number of multiplexers leads to an increase in the number of gates through which a signal is transmitted. Thus, in the semiconductor device capable of configuring the scan chain, when the circuit size is increased, the delay time of signal transmission that is caused in normal operation of the semiconductor device tends to be long.

In view of the above technical background, an object of one embodiment of present invention is to provide a semiconductor device including a logic circuit which can perform a scan test and can reduce signal delay.

According to one embodiment of the present invention, a semiconductor device includes a combinational circuit, a plurality of sequential circuits each holding first data supplied to the combinational circuit or second data output from the combinational circuit, and a plurality of first memory circuits corresponding to the plurality of sequential circuits. The first memory circuit holds the first data supplied to the corresponding sequential circuit. Further, the first memory circuit holds the second data output from the corresponding sequential circuit.

According to one embodiment of the present invention, the semiconductor device includes a plurality of second memory circuits electrically connecting the plurality of first memory circuits in series by supplying the first data or second data supplied from one of the first memory circuits to another one of the first memory circuits. The second memory circuit includes a first switch which controls the supply of data to a node, a capacitor electrically connected to the node, and a second switch which controls output of the data from the node.

In the semiconductor device of one embodiment of the present invention, by using the plurality of first memory circuits connected in series through the plurality of second memory circuits, without connecting the plurality of sequential circuits in series, first data for verification can be written to the plurality of sequential circuits from an external input/output terminal through the plurality of first memory circuits in operation verification. Further, without connecting the plurality of sequential circuits in series, second data for verification held in the plurality of sequential circuits can be read from the external input/output terminal through the plurality of first memory circuits. Accordingly, the operation of a combinational circuit can be verified without a logic circuit such as a multiplexer for connecting a plurality of sequential circuits in series on the input side in each of the plurality of sequential circuits. Thus, in the case of normal operation, i.e., in the case where first data is data for normal operation, by supplying the first data to a combinational circuit, second data output from the combinational circuit can be supplied to a sequential circuit without a logic circuit such as a multiplexer.

According to one embodiment of the present invention, it is possible to provide a semiconductor device including a logic circuit which can perform a scan test and can reduce signal delay.

BRIEF DESCRIPTION OF THE DRAWINGS

In the accompanying drawings.

DETAILED DESCRIPTION OF THE INVENTION

Embodiments of the present invention will be described below in detail with reference to the drawings. Note that the present invention is not limited to the following description and it is easily understood by those skilled in the art that the mode and details can be variously changed without departing from the scope and spirit of the present invention. Therefore, the present invention should not be construed as being limited to the description in the embodiments below.

Note that the present invention includes, in its category, any semiconductor device including sequential circuits and combinational circuits, for example, integrated circuits, RF tags, and semiconductor display devices. The integrated circuit include, in its category, large scale integrated circuits (LSIs) including a microprocessor, an image processing circuit, a digital signal processor (DSP), and a microcontroller and programmable logic devices (PLDs) such as a field programmable gate array (FPGA) and a complex PLD (CPLD). Further, the semiconductor display device includes, in its category, semiconductor display devices in which sequential circuits and combinational circuits are included in driver circuits, controllers, and the like, such as liquid crystal display devices, light-emitting devices in which a light-emitting element typified by an organic light-emitting element is provided in each pixel, electronic paper, digital micromirror devices (DMDs), plasma display panels (PDPs), and field emission displays (FEDs).

<Structural Example 1 of Semiconductor Device>

Figure 1:
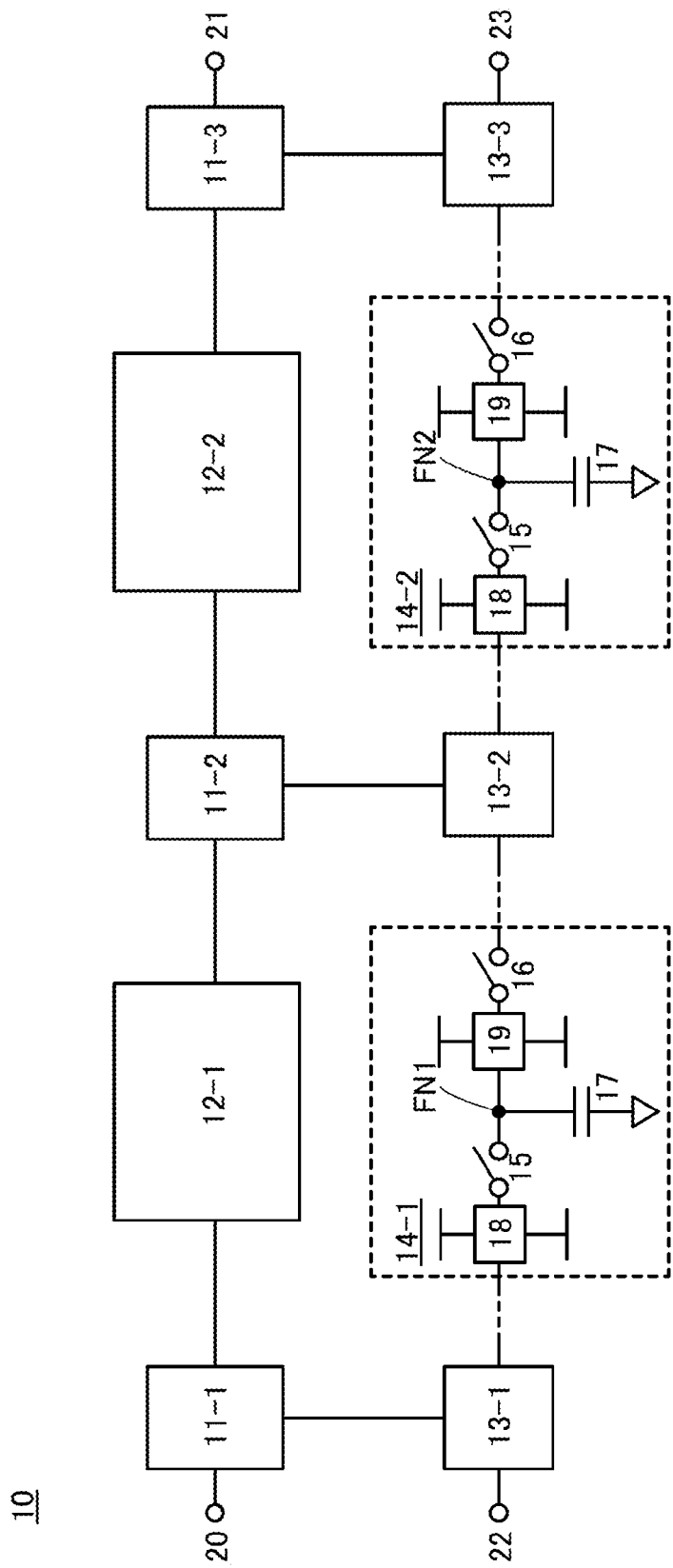
FIG. 1 illustrates a structure of a semiconductor device.

FIG. 1 is a block diagram illustrating a structural example of a semiconductor device 10 of one embodiment of the present invention. Although the block diagram attached to this specification shows components classified by their functions in independent blocks, it is difficult to classify actual components according to their functions completely and it is possible for one component to have a plurality of functions.

The semiconductor device 10 illustrated in FIG. 1 includes a plurality of sequential circuits 11 (sequential circuits 11-1 to 11-3), a plurality of combinational circuits 12 (combinational circuits 12-1 and 12-2), a plurality of first memory circuits 13 (first memory circuits 13-1 to 13-3), and a plurality of second memory circuits (also referred to as a relay memory circuit) 14 (second memory circuits 14-1 and 14-2).

As the sequential circuit 11, a flip-flop or the like can be used. The sequential circuit 11 holds data supplied to the combinational circuit 12. Further, the sequential circuit 11 holds data output from the combinational circuit 12.

Specifically, the sequential circuit 11-1 holds data supplied to the combinational circuit 12-1. The sequential circuit 11-2 holds data output from the combinational circuit 12-1 by supplying the data from the sequential circuit 11-1 to the combinational circuit 12-1. Further, the sequential circuit 11-2 holds data supplied to the combinational circuit 12-2. The sequential circuit 11-3 holds data output from the combinational circuit 12-2 by supplying the data from the sequential circuit 11-2 to the combinational circuit 12-2.

The combinational circuit 12 is a logic circuit including one or more logic gates, performs logical operation with supplied data, and outputs data obtained by the logical operation.

The plurality of first memory circuits 13 correspond to the plurality of sequential circuits 11. The first memory circuit 13 holds data supplied to the corresponding sequential circuit 11. Further, the first memory circuit 13 holds data output from the corresponding sequential circuit 11.

Specifically, FIG. 1 illustrates an example where the first memory circuits 13-1 to 13-3 correspond to the sequential circuits 11-1 to 11-3, respectively. The first memory circuit 13-1 holds data supplied to the sequential circuit 11-1, the first memory circuit 13-2 holds data supplied to the sequential circuit 11-2, and the first memory circuit 13-3 holds data supplied to the sequential circuit 11-3. The first memory circuit 13-1 holds data output from the sequential circuit 11-1, the first memory circuit 13-2 holds data output from the sequential circuit 11-2, and the first memory circuit 13-3 holds data output from the sequential circuit 11-3.

The second memory circuit 14 holds data supplied from one of the first memory circuits 13 and supplies the held data to another one of the first memory circuits 13. The semiconductor device 10 includes the second memory circuits 14 between the plurality of first memory circuits 13 and thus can transfer data supplied to one of the first memory circuits 13 to the first memory circuit 13 in the subsequent stage through the second memory circuit 14. In other words, the plurality of first memory circuits 13 are connected in series through the second memory circuits 14.

Specifically, in FIG. 1, the second memory circuit 14-1 is positioned on the output side of the first memory circuit 13-1 and the input side of the first memory circuit 13-2. The second memory circuit 14-2 is positioned on the output side of the first memory circuit 13-2 and the input side of the first memory circuit 13-3. In FIG. 1, the second memory circuit 14-1 holds data supplied from the first memory circuit 13-1 and supplies the held data to the first memory circuit 13-2. The second memory circuit 14-2 holds the data supplied from the first memory circuit 13-2 and supplies the held data to the first memory circuit 13-3. Thus, data supplied to the first memory circuit 13-1 can be transferred to the first memory circuit 13-2 or 13-3 in the subsequent stage through the second memory circuit 14-1 or 14-2. Consequently, the first memory circuits 13-1 to 13-3 are connected in series through the second memory circuits 14.

The second memory circuit 14 includes a switch 15 which controls supply of data to a node FN in the second memory circuit 14, a capacitor 17 electrically connected to the node FN, a switch 16 which controls output of the data from the node FN, and logic gates 18 and 19. In FIG. 1, a node supplied with data in the second memory circuit 14-1 is referred to as a node FN1 and a node supplied with data in the second memory circuit 14-2 is referred to as a node FN2.

A high-level potential and a low-level potential are supplied to the logic gate 18 and the logic gate 19. The logic gate 18 and the logic gate 19 prevent a decrease in amplitude of a potential of a signal including input data by outputting a high-level potential or a low-level potential in accordance with the input data. For example, an inverter or a buffer can be used as the logic gate 18 or the logic gate 19.

Specifically, in FIG. 1, when the switch 15 is on and the switch 16 is off, data supplied from the first memory circuit 13-1 passes through the logic gate 18 and then is supplied to the node FN through the switch 15. When the switch 15 is off and the switch 16 is on, the data held in the node FN passes through the logic gate 19 and then is supplied to the first memory circuit 13-2 in the subsequent stage through the switch 16.

<Operation Example of Semiconductor Device>

Next, a normal operation example and verification operation example of the semiconductor device 10 of one embodiment of the present invention is described taking the semiconductor display device 10 in FIG. 1 as an example.

First, normal operation of the semiconductor device 10 is described. In the case of normal operation, data used for the normal operation is supplied from a terminal 20 to the sequential circuit 11-1. The sequential circuit 11-1 holds the supplied data and supplies the data to the combinational circuit 12-1 in accordance with a signal e.g., a clock signal for controlling operation of the sequential circuit 11-1. The combinational circuit 12-1 performs logical operation with the supplied data and outputs data obtained by the logical operation. The sequential circuit 11-2 holds the data supplied from the combinational circuit 12-1 and supplies the data to the combinational circuit 12-2 in accordance with a signal, e.g., a clock signal for controlling operation of the sequential circuit 11-2. The combinational circuit 12-2 performs logical operation with the supplied data and outputs data obtained by the logical operation. The sequential circuit 11-3 holds the data supplied from the combinational circuit 12-2 and supplies the data to a terminal 21 in accordance with a signal, e.g., a clock signal for controlling operation of the sequential circuit 11-3.

Next, the verification operation of the semiconductor device 10 is described. In the case of the verification operation, first, data for verification is written to (scanned in) the plurality of first memory circuits 13.

Specifically, data D1 for verification is supplied to the first memory circuit 13-1 from a terminal 22. The data D1 for verification that is supplied to the first memory circuit 13-1 is held in the first memory circuit 13-1. In the second memory circuit 14-1, the switch 15 is turned on and the switch 16 is turned off, whereby the data D1 for verification is supplied from the first memory circuit 13-1 to the node FN1. Next, in the second memory circuit 14-1, the switch 15 is turned off and the switch 16 is turned on, so that the data D1 for verification is supplied from the node FN1 to the first memory circuit 13-2. The data D1 for verification supplied to the first memory circuit 13-2 is held in the first memory circuit 13-2. Further, in parallel with the supply of the data D1 for verification to the first memory circuit 13-2, data D2 for verification is supplied from the terminal 22 to the first memory circuit 13-1. The data D2 for verification supplied to the first memory circuit 13-1 is held in the first memory circuit 13-1.

After writing (scanning in) data for verification to the plurality of first memory circuits 13 is finished, the data for verification that are written to the plurality of first memory circuits 13 are written to the corresponding sequential circuits 11.

Specifically, the data D2 for verification held in the first memory circuit 13-1 is supplied to the sequential circuit 11-1 corresponding to the first memory circuit 13-1. The data D2 for verification supplied to the sequential circuit 11-1 is held in the sequential circuit 11-1. Further, the data D1 for verification held in the first memory circuit 13-2 is supplied to the sequential circuit 11-2 corresponding to the first memory circuit 13-2. The data D1 for verification supplied to the sequential circuit 11-2 is held in the sequential circuit 11-2.

Next, by supplying data for verification held in the plurality of sequential circuits 11 to the respective combinational circuits 12, the combinational circuits 12 perform logical operation by using the data for verification. Then, data for verification obtained by the logical operation is written to (captured by) the plurality of sequential circuits 11, and the data for verification is held in the plurality of sequential circuits 11.

Specifically, the data D2 for verification held in the sequential circuit 11-1 is supplied to the combinational circuit 12-1, and data Q2 for verification obtained by logical operation performed in the combinational circuit 12-1 is written to the sequential circuit 11-2 that is the subsequent stage of the combinational circuit 12-1. Thus, the data Q2 is held in the sequential circuit 11-2. In parallel with the above operation, the data D1 for verification held in the sequential circuit 11-2 is supplied to the combinational circuit 12-2, and the data Q1 for verification obtained by logical operation performed in the combinational circuit 12-2 is written to the sequential circuit 11-3 that is the subsequent stage of the combinational circuit 12-2. The data Q1 is held in the sequential circuit 11-3.

Next, the data for verification held in the plurality of sequential circuits 11 is written to the corresponding first memory circuits 13.

Specifically, the data Q2 for verification held in the sequential circuit 11-2 is written to and held in the first memory circuit 13-2. Further, the data Q1 for verification held in the sequential circuit 11-3 is written to and held in the first memory circuit 13-3.

Next, the data for verification is read (scanned out) from the plurality of first memory circuits 13.

Specifically, the data Q1 for verification held in the first memory circuit 13-3 is supplied to a terminal 23. In parallel with the supply of the data Q1 for verification to the terminal 23, the switch 15 is turned on and the switch 16 is turned off in the second memory circuit 14-2; thus, the data Q2 for verification is supplied from the first memory circuit 13-2 to the node FN2. Next, the switch 15 is turned off and the switch 16 is turned on in the second memory circuit 14-2; thus, the data Q2 for verification is supplied from the node FN2 to the first memory circuit 13-3. The data Q2 for verification supplied to the first memory circuit 13-3 is held in the first memory circuit 13-3. Next, the data Q2 for verification held in the first memory circuit 13-3 is supplied to the terminal 23. By the above operation, the data Q1 for verification and the data Q2 for verification are read from the terminal 23.

In the semiconductor device 10 of one embodiment of the present invention, by using the plurality of first memory circuits 13 that are connected in series through the plurality of second memory circuits 14 as described above, data for verification can be written to the plurality of sequential circuits 11 through the terminal 22 and data for verification can be read from the plurality of sequential circuits 11 through the terminal 23, even when the plurality of sequential circuits 11 are not connected in series. Thus, the operation of the combinational circuit 12 can be verified without logic circuits such as multiplexers for connecting the plurality of sequential circuits 11 in series on the input side of each of the plurality of the sequential circuits 11. Therefore, in the case of normal operation, i.e., the case where data is for normal operation, data output from the combinational circuit 12 can be supplied to the sequential circuit 11 without a logic circuit such as a multiplexer by supplying the data to the combinational circuit 12.

<Structural Example 2 of Semiconductor Device>

Note that FIG. 1 illustrates the semiconductor device 10 in which a sequential circuit for supplying data to one combinational circuit 12 and a sequential circuit to which data is supplied from the one combinational circuit 12 are provided. However, in the semiconductor device 10 of one embodiment of the present invention, for one combinational circuit 12, a plurality of sequential circuits for supplying data or a plurality of sequential circuits to which data are supplied from the one combinational circuit 12 may be provided.

Figure 2:
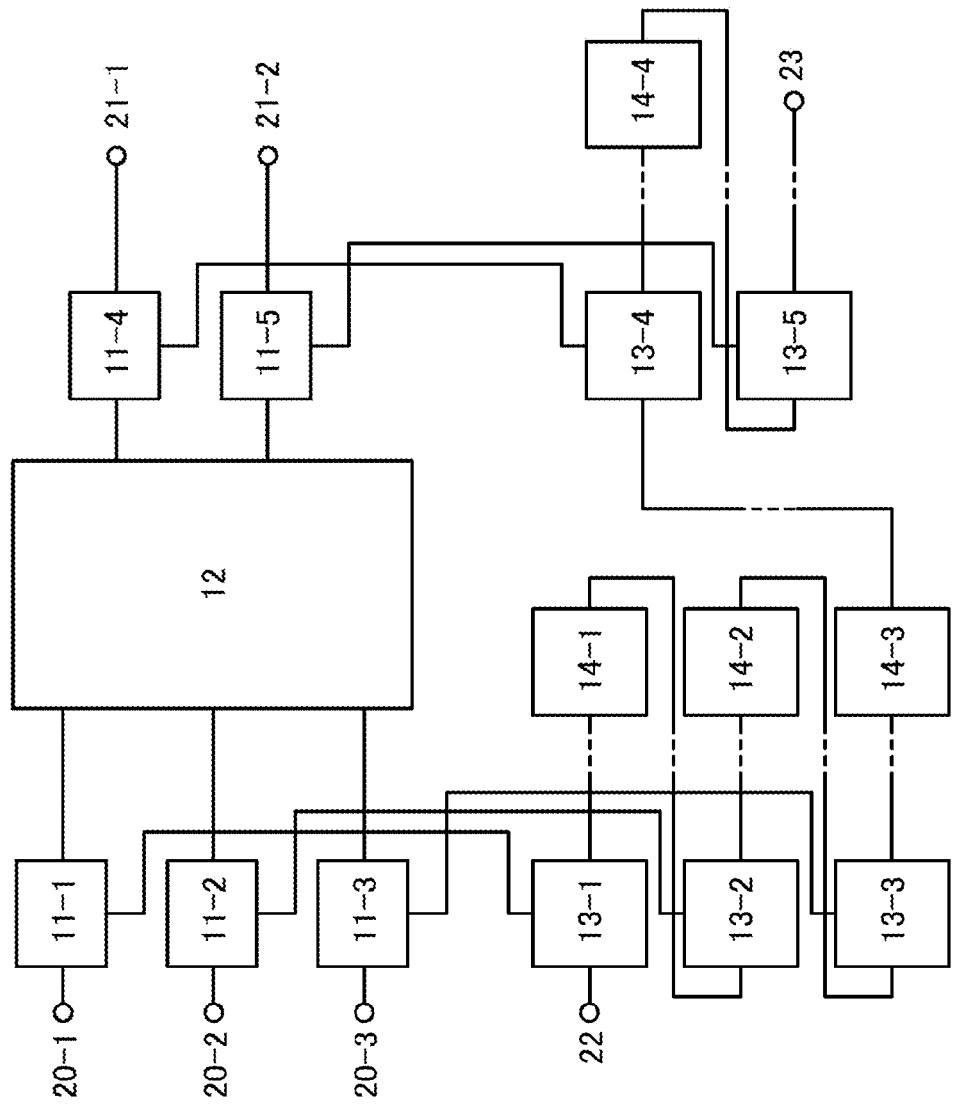
FIG. 2 illustrates a structure of a semiconductor device.

FIG. 2 is a block diagram illustrating a structural example of the semiconductor device 10 of one embodiment of the present invention, in which for one combinational circuit 12, a plurality of sequential circuits 11 for supplying data or a plurality of sequential circuits 11 to which data are supplied from the one combinational circuit 12 are provided.

The semiconductor device 10 illustrated in FIG. 2 includes a plurality of sequential circuits 11 (sequential circuits 11-1 to 11-5), the combinational circuit 12, a plurality of first memory circuits 13 (first memory circuits 13-1 to 13-5), and a plurality of second memory circuits 14 (second memory circuits 14-1 to 14-4).

The sequential circuits 11-1 to 11-3 each hold data supplied to the combinational circuit 12. The sequential circuits 11-4 and 11-5 each hold data output from the combinational circuit 12 by supplying data from the sequential circuits 11-1 to 11-3 to the combinational circuit 12.

Further, in FIG. 2, the first memory circuits 13-1 to 13-5 correspond to the sequential circuits 11-1 to 11-5, respectively. The first memory circuits 13-1 to 13-3 hold data supplied to the sequential circuits 11-1 to 11-3, respectively. The first memory circuits 13-4 and 13-5 hold data output from the sequential circuits 11-4 and 11-5, respectively.

The second memory circuit 14-1 is connected to the output side of the first memory circuit 13-1 and the input side of the first memory circuit 13-2. The second memory circuit 14-2 is connected to the output side of the first memory circuit 13-2 and the input side of the first memory circuit 13-3. The second memory circuit 14-3 is connected to the output side of the first memory circuit 13-3 and the input side of the first memory circuit 13-4. The second memory circuit 14-4 is connected to the output side of the first memory circuit 13-4 and the input side of the first memory circuit 13-5. Thus, the first memory circuits 13-1 to 13-5 are connected in series through the second memory circuits 14-1 to 14-4.

<Specific Structural Example of Semiconductor Device>

Figure 3:
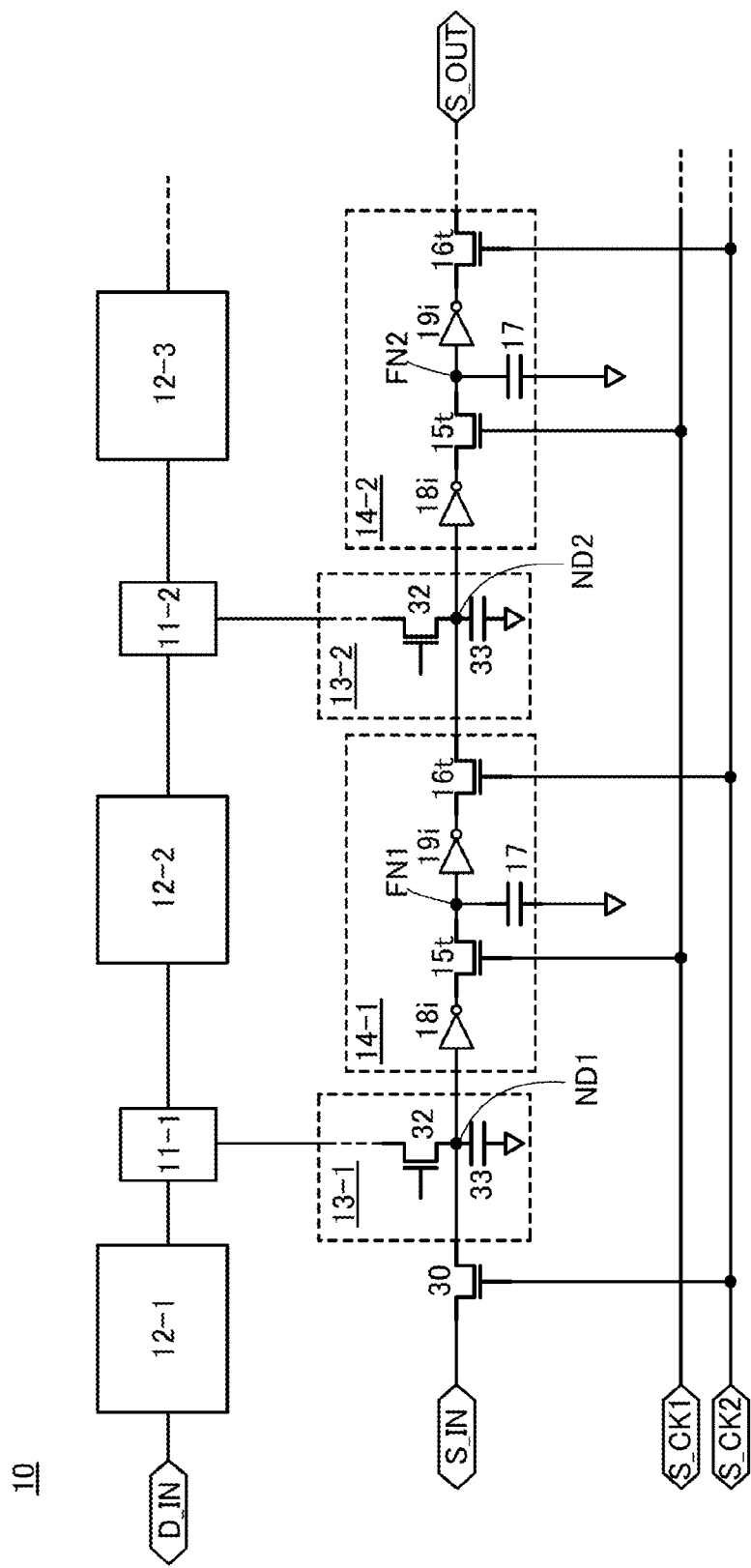
FIG. 3 illustrates a structure of a semiconductor device.

Next, FIG. 3 illustrates a more specific structural example of the semiconductor device 10 in FIG. 1.

The semiconductor device 10 illustrated in FIG. 3 includes a plurality of sequential circuits 11, a plurality of combinational circuits 12, a plurality of first memory circuits 13, and a plurality of second memory circuits 14, like the semiconductor device 10 in FIG. 1. Specifically, the semiconductor device 10 illustrated in FIG. 3 includes the plurality of sequential circuits 11 (sequential circuits 11-1 to 11-$x$ ($x$ is a natural number of 2 or more)), the plurality of combinational circuits 12 (combinational circuits 12-1 to 12-$x$), the plurality of first memory circuits 13 (first memory circuits 13-1 to 13-$x$), and the plurality of second memory circuits 14 (second memory circuits 14-1 to 14-$x$).

Further, the semiconductor device 10 in FIG. 3 includes a transistor 30 on the input side of the first memory circuit 13-1. The transistor 30 controls supply of a signal S_IN including data for verification to the first memory circuit 13-1 in accordance with a signal S_CK2 input to a gate of the transistor 30.

In the semiconductor device 10 in FIG. 3, a signal D_IN including data used in normal operation is supplied to the combinational circuit 12-1.

In the semiconductor device 10 in FIG. 3, the first memory circuit 13 includes a transistor 32 and a capacitor 33. The transistor 32 holds data supplied to a node ND. The capacitor 33 holds the data supplied to the node ND.

Note that in FIG. 3, the first memory circuits 13-1 to 13-$x$ include nodes ND1 to NDx, respectively.

The semiconductor device 10 in FIG. 3 includes a transistor 15$t$ serving as the switch 15, a transistor 16$t$ serving as the switch 16, the capacitor 17, an inverter 18$i$ serving as the logic gate 18, an inverter 19$i$ serving as the logic gate 19, and the second memory circuit 14. The on/off state of the transistor 15$t$ is selected in accordance with a signal S_CK1 input to a gate of the transistor 15$t$. The on/off state of the transistor 16$t$ is selected in accordance with a signal S_CK2 input to a gate of the transistor 16$t$. The data supplied from the first memory circuit 13 is supplied to the node FN through the transistor 15$t$ after passing through the inverter 18$i$. The data is supplied from the node FN to the first memory circuit 13 in the subsequent stage through the transistor 16$t$ after passing through the inverter 19$i$.

The transistor used for the semiconductor device 10 may include a channel formation region in a semiconductor film of silicon, germanium, or the like in an amorphous, microcrystalline, polycrystalline, or single crystal state. Alternatively, the transistor used for the semiconductor device 10 may include a channel formation region in an oxide semiconductor film.

A transistor in which a channel formation region is formed in a film of a semiconductor having a wider band gap and lower intrinsic carrier density than silicon has an extremely small off-state current. Examples of such a semiconductor are an oxide semiconductor and gallium nitride that have a band gap more than twice as wide as that of silicon. A transistor including the semiconductor can have a much smaller off-state current than a transistor including a normal semiconductor such as silicon or germanium. Thus, the use of the transistor 15$t$ or transistor 16$t$ having the above structure for the second memory circuit 14 can ensure a long data retention time at the node FN in the second memory circuit 14.

Note that off-state current in this specification refers to current flowing in a cut-off region between a source and a drain of a transistor, unless otherwise specified.

<Specific Operation Example of Semiconductor Device>

Figure 4:
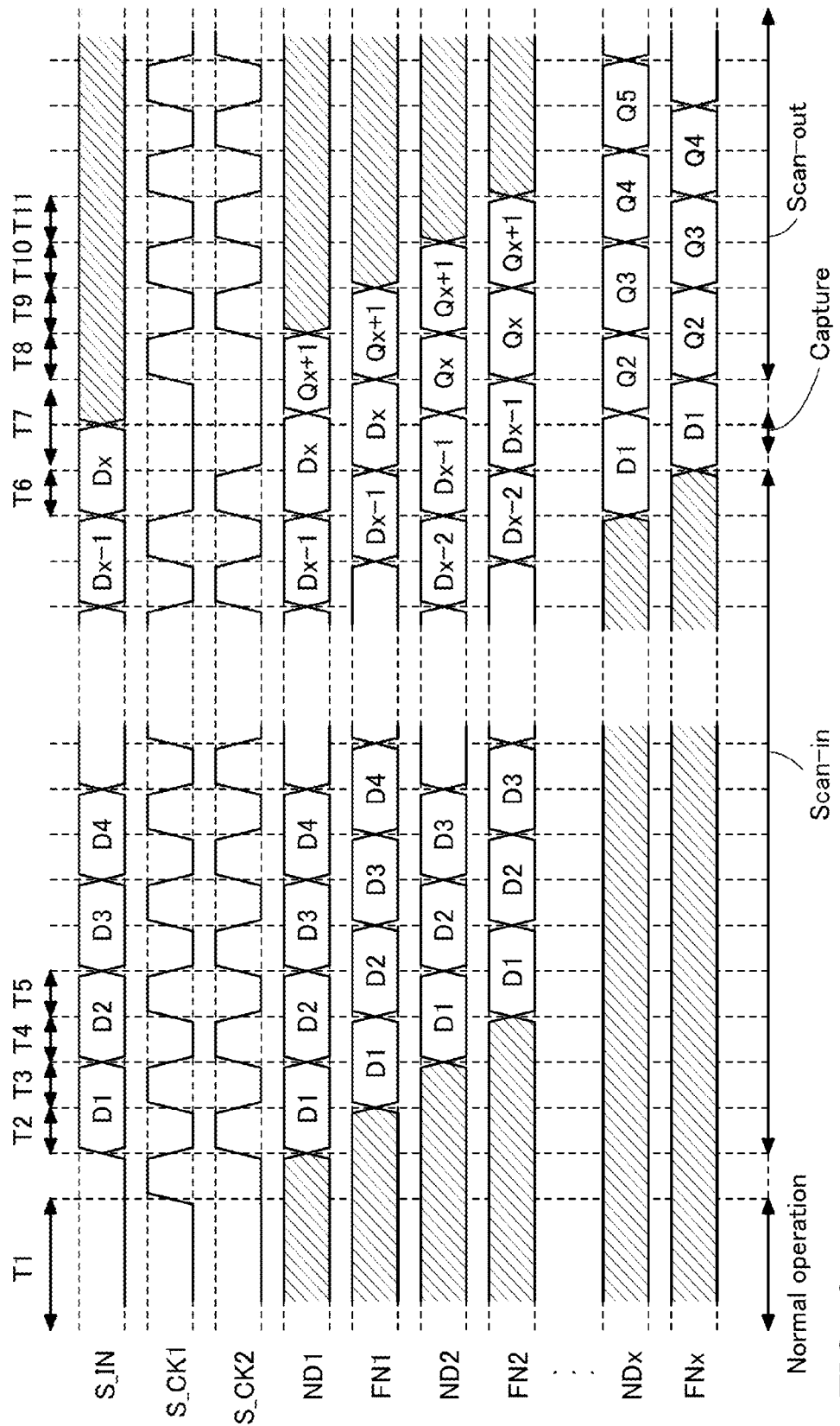
FIG. 4 is a timing chart.

Next, an operation example of the semiconductor device 10 illustrated in FIG. 3 is described using a timing chart in FIG. 4.

First, the semiconductor device 10 performs normal operation in a period T1. In the period T1, as shown in FIG. 4, all the potentials of the signals S_IN, S_CK1, and S_CK2 become a low level. Thus, the transistors 30, 15$t$, and 16$t$ are off.

Note that in the period T1, the potential levels of the nodes ND1 to NDx and the potential levels of the nodes FN1 to FNx are not particularly determined. In the timing chart in FIG. 4, a period during which the potential is not determined is shown by a shaded portion.

Next, in the semiconductor device 10, scan-in operation is performed. In the scan-in operation, first, in a period T2, the potential of the signal S_CK1 becomes a low level and the potential of the signal S_CK2 becomes a high level. Thus, the transistors 30 and 16$t$ are turned on and the transistor 15$t$ is kept off. Then, the signal S_IN including data D1 for verification is input to the node ND1 in the first memory circuit 13-1 through the transistor 30.

Next, in a period T3, the potential of the signal S_CK1 becomes a high level and the potential of the signal S_CK2 becomes a low level. Thus, the transistors 30 and 16$t$ are turned off and the transistor 15$t$ is turned on. Then, the signal S_IN including data D1 for verification is input from the node ND1 to the node FN1 in the second memory circuit 14-1 through the inverter 18$i$ and the transistor 15$t$.

Note that the polarity of the potential of the signal S_IN is inverted by the inverter 18$i$. Actually, the polarity of the potential of the signal S_IN supplied to the node ND1 and the polarity of the potential of the signal S_IN supplied to the node FN1 are opposite to each other.

Next, in a period T4, the potential of the signal S_CK1 becomes a low level and the potential of the signal S_CK2 becomes a high level. Thus, the transistors 30 and 16$t$ are turned on and the transistor 15$t$ is turned off. Then, the signal S_IN including data D2 for verification is input to the node ND1 in the first memory circuit 13-1 through the transistor 30. The signal S_IN including the data D1 for verification is input from the node FN1 to the node ND2 in the first memory circuit 13-1 through the inverter 19$i$ and the transistor 16$t$.

Next, in a period T5, the potential of the signal S_CK1 becomes a high level and the potential of the signal S_CK2 becomes a low level. Thus, the transistors 30 and 16$t$ are turned off and the transistor 15$t$ is turned on. Then, the signal S_IN including the data D2 for verification is input from the node ND1 to the node FN1 in the second memory circuit 14-1 through the inverter 18$i$ and the transistor 15$t$. Further, the signal S_IN including the data D1 for verification is input from the node ND2 to the node FN2 in the second memory circuit 14-2 through the inverter 18$i$ and the transistor 15$t$.

Operation similar to the operation from the periods T2 to T5 is performed; thus, finally, data Dx−1 to D1 for verification are supplied to the nodes ND1 to ND(x−1) in the first memory circuits 13-1 to 13-(*x*−1), respectively, as in a period T6. In other words, scan-in operation from the period T2 is finished in the period T6.

Next, capture operation is performed in a period T7. Specifically, in the period T7, the potential of the signal S_CK1 becomes a low level and the potential of the signal S_CK2 becomes a low level. Thus, the transistors 30, 15t, and 16t are turned off. Then, the capture operation is performed as follows: data for verification is written from the first memory circuit 13 to the sequential circuit 11, and then, data for verification output from the combinational circuit 12 is written to the sequential circuit 11 in the subsequent stage. Then, the data for verification is written from the sequential circuit 11 to the first memory circuit 13.

Note that in the timing chart in FIG. 4, by supplying the data Dx to D2 for verification to the combinational circuits 12-2 to 12-*x*, respectively, data Qx to Q2 for verification is supplied to the nodes ND2 to NDx, respectively.

Further, a signal S_IN including data Dx+1 for verification is additionally supplied from a terminal to which the signal D_IN is input to the combinational circuit 12-1. By the above operation, as shown in FIG. 4, data Qx+1 for verification is supplied to the node ND1.

Although the period T7 is shorter than one cycle of each of the signals S_CK1 and S_CK2 in FIG. 4, the length of the period T7 can be determined as appropriate by adjusting the length of a period during which the signals S_CK1 and S_CK2 are each at a low level.

Next, in the semiconductor device 10, scan-out operation is performed. In the scan-out operation, first, in a period T8, the potential of the signal S_CK1 becomes a high level and the potential of the signal S_CK2 becomes a low level. Thus, the transistors 30 and 16t are turned off and the transistor 15t is turned on. Then, a signal S_OUT including the data Qx+1 to Q2 for verification is input from the nodes ND1 to NDx to the nodes FN1 to FNx through the inverter 18i and the transistor 15t.

Next, in a period T9, the potential of the signal S_CK1 becomes a low level and the potential of the signal S_CK2 becomes a high level. Thus, the transistors 30 and 16t are turned on and the transistor 15t is turned off. Then, the signal S_OUT including the data Qx+1 to Q3 for verification is input from the nodes FN1 to FNx−1 to the nodes ND2 to NDx through the inverter 19i and the transistor 16t. Further, the signal S_OUT including the data Q2 for verification is output from the semiconductor device 10 through the inverter 19i and the transistor 16t.

Next, in a period T10, the potential of the signal S_CK1 becomes a high level and the potential of the signal S_CK2 becomes a low level. Thus, the transistors 30 and 16t are turned off and the transistor 15t is turned on. Then, the signal S_OUT including the data Qx+1 to Q3 for verification is input from the nodes ND2 to NDx to the nodes FN2 to FNx through the inverter 18i and the transistor 15t.

Next, in a period T11, the potential of the signal S_CK1 becomes a low level and the potential of the signal S_CK2 becomes a high level. Thus, the transistors 30 and 16t are turned on and the transistor 15t is turned off. Then, the signal S_OUT including the data Qx+1 to Q4 for verification is input from the nodes FN2 to FNx−1 to the nodes ND3 to NDx through the inverter 19i and the transistor 16t. Further, the signal S_OUT including the data Q3 for verification is output from the semiconductor device 10 through the inverter 19i and the transistor 16t.

By performing operation similar to the operation from the periods T8 to T11 repeatedly, finally, all the data Qx+1 to Q2 for verification is output from the semiconductor device 10 and the scan-out operation can be finished.

<Structural Examples 1 of First Memory Circuit and Sequential Circuit>

Next, a specific structural example of the first memory circuit 13 is described.

Figure 5:
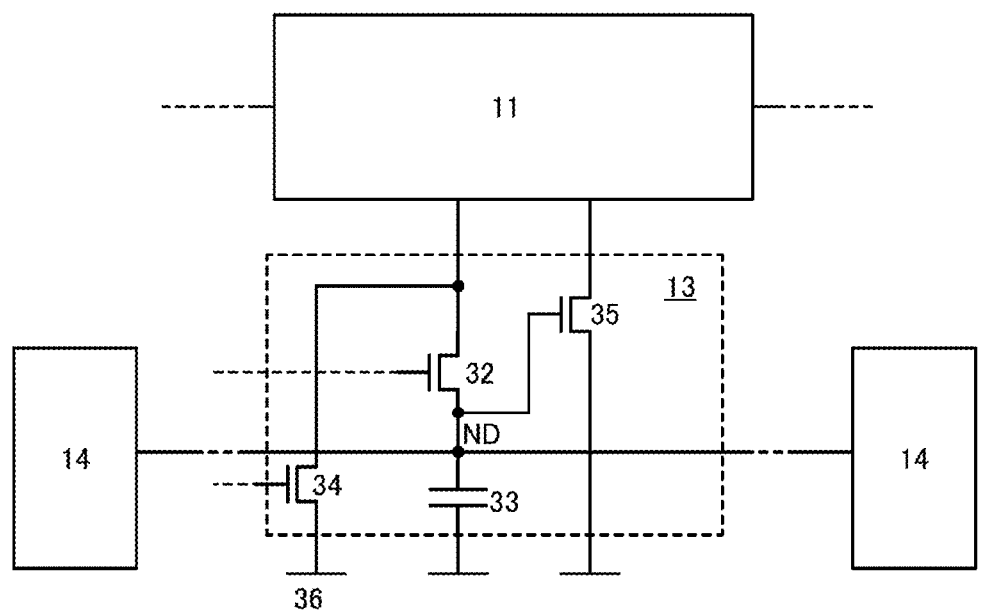
FIG. 5 illustrates a structure of a second memory circuit.

FIG. 5 illustrates an example of connection between the sequential circuit 11, the first memory circuit 13, and the second memory circuit 14.

The first memory circuit 13 includes transistors 34 and 35 in addition to the capacitor 33 and the transistor 32. The transistor 32 holds data supplied to the node ND. The capacitor 33 holds the data supplied to the node ND. The on/off state of the transistor 35 is selected in accordance with the data held in the node ND. The transistor 34 supplies the potential of a wiring 36 to the node ND when the transistor 32 is on. The node ND is connected to the second memory circuit 14.

Figure 6:
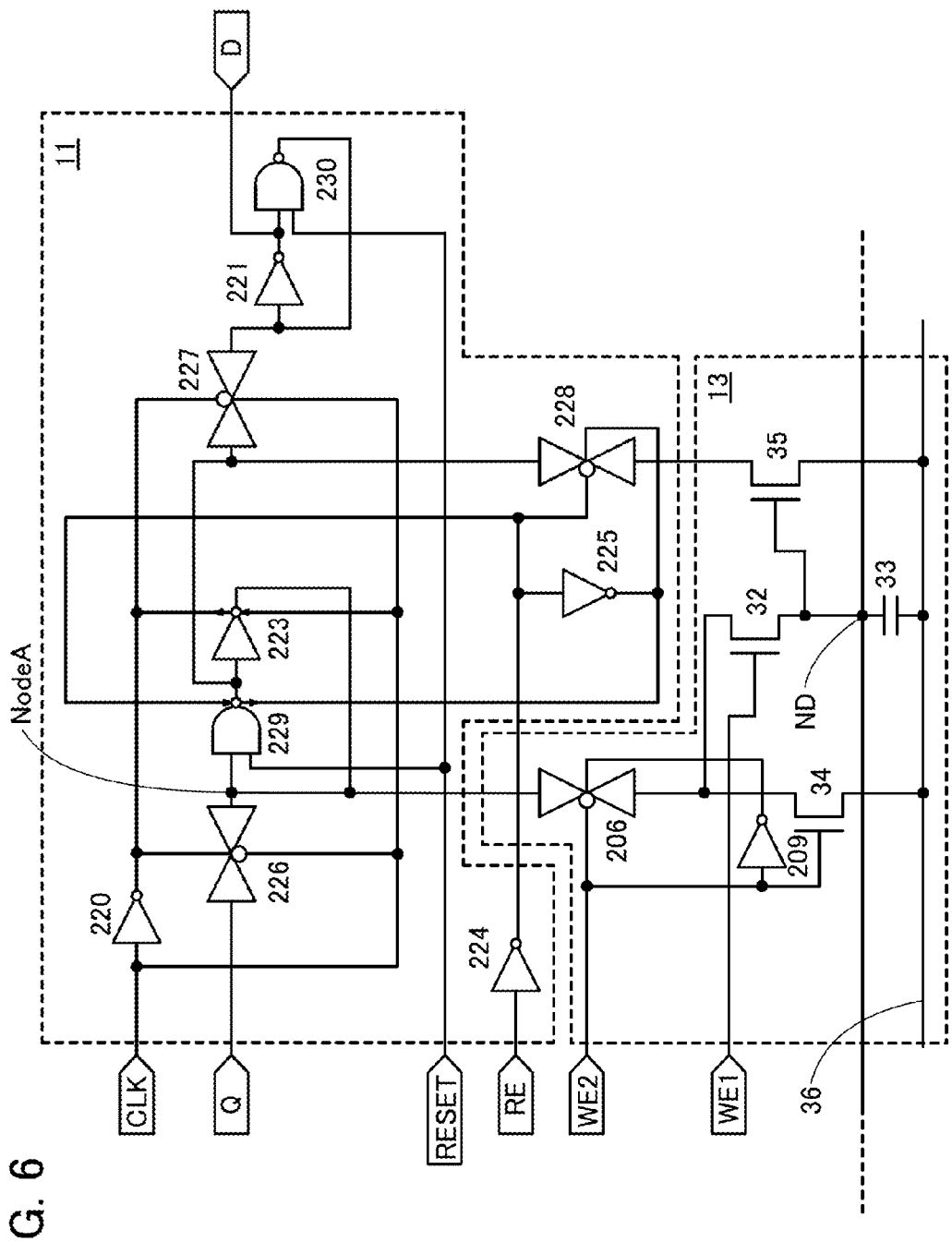
FIG. 6 illustrates structures of a first memory circuit and a second memory circuit.

Next, FIG. 6 illustrates more specific structural examples of the sequential circuit 11 and the first memory circuit 13 that are illustrated in FIG. 5.

The sequential circuit 11 includes inverters 220, 221, 223, 224, and 225, transmission gates 226 to 228, and NANDs 229 and 230. In addition, the first memory circuit 13 includes the transistor 32, the transistor 35, the capacitor 33, a transmission gate 206, the transistor 34, and an inverter 209.

The inverter 220 generates a clock signal CLKb which is obtained by inverting the polarity of the potential of the clock signal CLK. The on/off states of the transmission gates 226 and 227 are selected in accordance with the clock signals CLK and CLKb, and whether the inverter 223 outputs a signal is determined in response to the clock signals CLK and CLKb.

Specifically, the transmission gate 226 supplies data Q for normal operation or data Q for verification which has been supplied to an input terminal of the transmission gate 226 to a first input terminal of the NAND 229 and an input terminal of the transmission gate 206 included in the first memory circuit 13, when the potential of the clock signal CLK is at a low (L) level and the potential of the clock signal CLKb is at a high (H) level. In addition, the transmission gate 226 becomes high impedance and stops supply of the data Q to the first input terminal of the NAND 229 and the input terminal of the transmission gate 206 in the first memory circuit 13, when the potential of the clock signal CLK is at a high level and the potential of the clock signal CLKb is at a low level.

Specifically, the transmission gate 227 supplies a signal which is input from an output terminal of the NAND 229 and data D for verification which is input from an output terminal of the transmission gate 228, to an input terminal of the inverter 221, when the potential of the clock signal CLK is at a high level and the potential of the clock signal CLKb is at a low level. In addition, the transmission gate 227 stops supply of a signal which is input from the output terminal of the NAND 229 or data D for verification which is input from the output terminal of the transmission gate 228, to the input terminal of the inverter 221, when the potential of the clock signal CLK is at a low level and the potential of the clock signal CLKb is at a high level.

In addition, the inverter 224 generates a signal REb which is an inverted signal obtained by inverting the polarity of the potential of a signal RE. The inverter 225 generates the signal RE by inverting the polarity of the potential of the signal REb. The transmission gate 228 and the NAND 229 each determine output of a signal in response to the signals RE and REb.

Specifically, the transmission gate 228 supplies data D for verification which is output from the first memory circuit 13, to an input terminal of the transmission gate 227 and an input terminal of the inverter 223, when the potential of the signal RE is at a high level and the potential of the signal REb is at a low level. In addition, the transmission gate 228 becomes high impedance and stops supply of data D for verification which is output from the first memory circuit 13 to the input terminal of the transmission gate 227 and the input terminal of the inverter 223, when the potential of the signal RE is at a low level and the potential of the signal REb is at a high level.

The NAND 229 is a NAND having two inputs. To the first input terminal is supplied data Q output from the transmission gate 226, and to a second input terminal is supplied a signal RESET. Then, the NAND 229 outputs a signal in response to the signals input to the first input terminal and the second input terminal, when the potential of the signal RE is at a low level and the potential of the signal REb is at a high level. In addition, the NAND 229 stops output of a signal irrespective of the signal input to the first input terminal and the second input terminal, when the potential of the signal RE is at a high level and the potential of the signal REb is at a low level.

The inverter 223 inverts the polarity of the potential of a signal which is supplied to the input terminal of the inverter 223 and outputs the inverted signal, when the potential of the clock signal CLK is at a high level and the potential of the clock signal CLKb is at a low level. The output signal is supplied to the first input terminal of the NAND 229.

The inverter 221 inverts the potentials of the signals supplied from the output terminal of the transmission gate 227 and the output terminal of the NAND 230, and outputs the inverted signals as data D for normal operation or data D for verification. The data D output from the inverter 221 is supplied to a first input terminal of the NAND 230.

The NAND 230 is a NAND having two inputs, and the data D output from the inverter 221 is supplied to the first input terminal and the signal RESET is supplied to the second input terminal.

The on/off state of the transistor 32 is selected in response to the potential of a signal WE1. In addition, the on/off state of the transmission gate 206 is selected in response to a signal WE2. Specifically, in FIG. 6, the on/off state of the transmission gate 206 is selected in response to the signal WE2 and a signal which is obtained by inverting the polarity of the signal WE2 by the inverter 209. The on/off state of the transistor 34 is selected in response to the signal WE2.

When the transmission gate 206 and the transistor 32 are on, data Q for verification held in a node A in the sequential circuit 11 is supplied to the node ND. In operation verification, data D for verification is supplied from the second memory circuit 14 to the node ND. Further, when the transistors 32 and 34 are on, the potential of the wiring 36 is supplied to the node ND.

The on/off state of the transistor 35 is selected in response to the potential of the node ND. When the transistor 35 is on, the potential of the wiring 36 is supplied to the sequential circuit 11 through the transistor 35. When the transistor 32 is off, the capacitor 33 holds the potential of the node ND.

The transistors used for the sequential circuit 11 and the first memory circuit 13 may each include a channel formation region in a semiconductor film of silicon, germanium, or the like in an amorphous, microcrystalline, polycrystalline, or single crystal state. Alternatively, the transistors used for the sequential circuit 11 and the first memory circuit 13 may each include a channel formation region in an oxide semiconductor film.

A transistor having a channel formation region in a film of a semiconductor having a wider band gap and lower intrinsic carrier density than silicon can have a much smaller off-state current than a transistor including a normal semiconductor such as silicon or germanium. Examples of such a semiconductor are an oxide semiconductor and gallium nitride that have a band gap more than twice as wide as that of silicon. Thus, the use of the transistor 32 having the above structure for the first memory circuit 13 can ensure a long data retention time at the node ND in the first memory circuit 13.

An oxide semiconductor film is used in the transistor 32, a silicon film is used in a transistor other than the transistor 32, and the transistor 32 and the capacitor 33 are stacked over the transistor including the silicon film, which leads to reduction in area of the first memory circuit 13.

<Structural Examples 2 of First Memory Circuit and Sequential Circuit>

Next, another specific structural example of the first memory circuit 13 is described.

Figure 7:
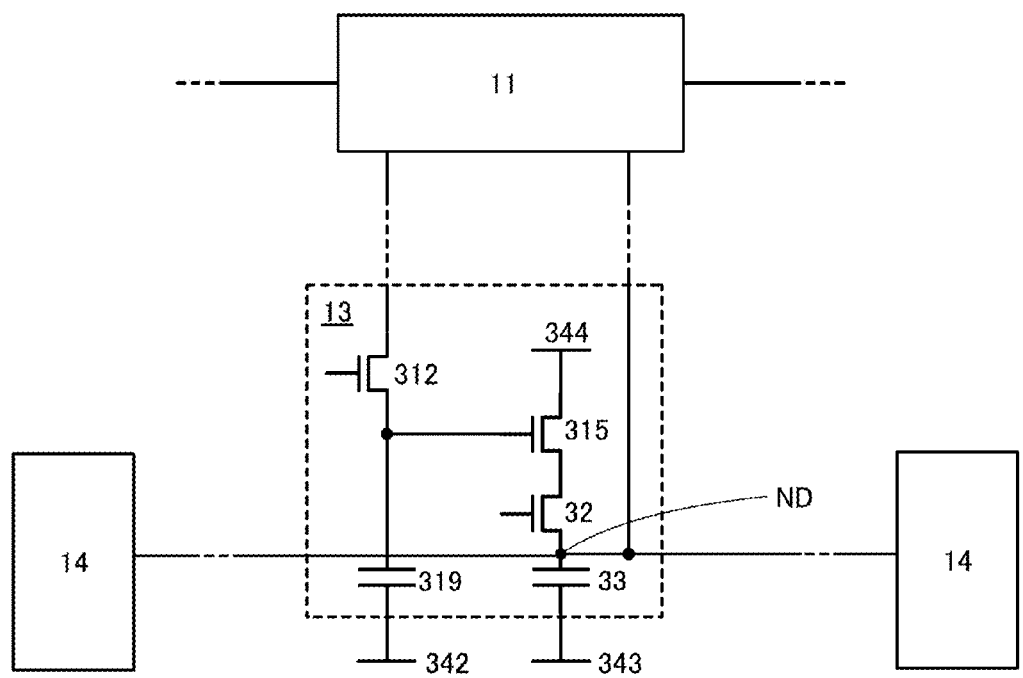
FIG. 7 illustrates a structure of a second memory circuit.

FIG. 7 illustrates an example of connection between the sequential circuit 11, the first memory circuit 13, and the second memory circuit 14.

The transistor 312 supplies data Q for normal operation or data Q for verification held in the sequential circuit 11 to a capacitor 319. The on/off state of the transistor 315 is selected in accordance with the data Q supplied to the capacitor 319. The transistor 32 supplies the potential of a wiring 344 to the capacitor 33 when the transistor 315 is on. Note that a potential different from the potential of the wiring 344 is supplied from the second memory circuit 14 in the previous stage to the node ND before the data Q is supplied to the capacitor 319. For example, when the potential of the wiring 344 is at a high level, a low-level potential is supplied from the second memory circuit 14 in the previous stage. In this case, the potential of the node ND is selected in accordance with the data Q. That is, the data Q is held in the node ND.

Specifically, one of a source and a drain of the transistor 312 is connected to the sequential circuit 11. The other of the source and the drain of the transistor 312 is connected to one electrode of the capacitor 319 and a gate of the transistor 315. The other electrode of the capacitor 319 is connected to a wiring 342. One of a source and a drain of the transistor 315 is connected to the wiring 344. The other of the source and the drain of the transistor 315 is connected to one of a source and a drain of the transistor 32. The other of the source and the drain of the transistor 32 is connected to one electrode of the capacitor 33 and the sequential circuit 11. The other electrode of the capacitor 33 is connected to a wiring 343.

Figure 8:
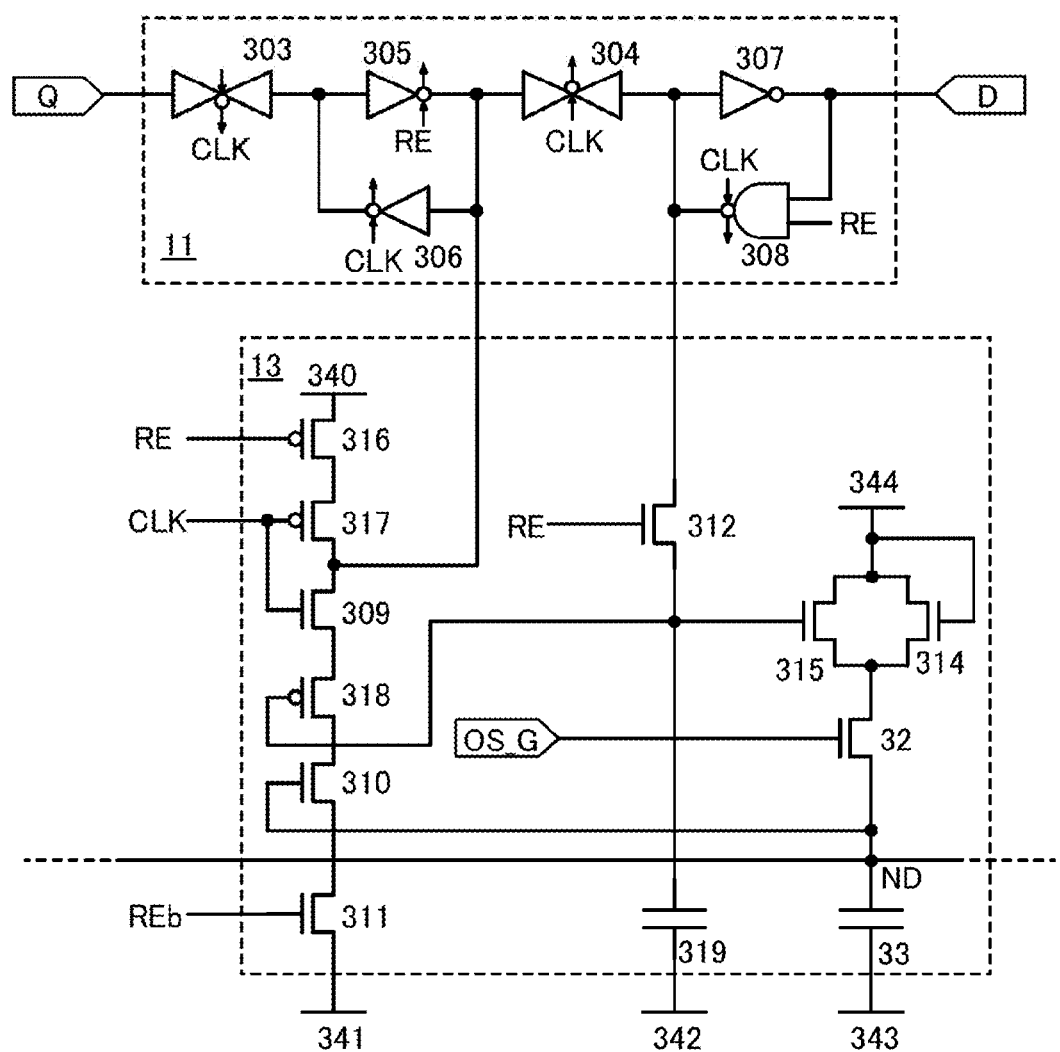
FIG. 8 illustrates structures of a first memory circuit and a second memory circuit.

Next, FIG. 8 illustrates a more specific structural example of the sequential circuit 11 and the first memory circuit 13 that are illustrated in FIG. 7.

The sequential circuit 11 includes a transmission gate 303, a transmission gate 304, inverters 305 to 307, and a NAND 308. Note that the sequential circuit 11 may further include another circuit element such as a diode, a resistor, or an inductor, as needed.

The transmission gate 303 determines output of a signal in response to the clock signal CLK. Specifically, the transmission gate 303 supplies data Q for normal operation or data Q for verification to an input terminal of the inverter 305 when the potential of the clock signal CLK is at a low level. Further, the transmission gate 303 becomes high impedance and stops supply of the data Q to the input terminal of the inverter 305 when the clock signal CLK has a high-level potential.

The inverter 305 determines output of a signal in response to the signal RE. Specifically, the inverter 305 inverts the polarity of the potential of a signal which is supplied to the input terminal and supplies the inverted signal to an input terminal of the transmission gate 304 and an input terminal of the inverter 306 when the potential of the signal RE is at a high level. Further, the inverter 305 stops supply of the signal to the input terminal of the transmission gate 304 and the input terminal of the inverter 306 when the potential of the signal RE is at a low level.

The inverter 306 determines output of a signal in response to the clock signal CLK. Specifically, the inverter 306 inverts the polarity of the potential supplied to the input terminal and supplies the inverted signal to the input terminal of the inverter 305 when the potential of the clock signal CLK is at a high level. Further, the inverter 306 stops supply of the signal to the input terminal of the inverter 305 when the potential of the clock signal CLK is at a low level.

The transmission gate 304 determines output of a signal in response to the clock signal CLK. Specifically, the transmission gate 304 supplies the signal supplied to the input terminal to an input terminal of the inverter 307 when the potential of the clock signal CLK is at a high level. Further, the transmission gate 304 becomes high impedance and stops supply of the signal to the input terminal of the inverter 307 when the potential of the clock signal CLK is at a low level.

The inverter 307 supplies data D for normal operation to a first input terminal of the NAND 308. The data D for normal operation is obtained by inverting the polarity of the potential supplied to the input terminal of the inverter 307.

The NAND 308 is a 2-input NAND and determines output of a signal in response to the clock signal CLK. A second input terminal of the NAND 308 is supplied with the signal RE. Specifically, the NAND 308 supplies a signal to the input terminal of the inverter 307 in response to the signal input to the first input terminal and the second input terminal when the potential of the clock signal CLK is at a low level. In addition, the NAND 308 stops supply of a signal irrespective of the signal input to the first input terminal and the second input terminal, when the potential of the clock signal CLK is at a high level.

The first memory circuit 13 includes the n-channel transistor 312, the capacitor 319, the n-channel transistor 32, an n-channel transistor 314, the n-channel transistor 315, and the capacitor 33. The first memory circuit 13 includes n-channel transistors 309 to 311 and p-channel transistors 316 to 318. Note that another circuit element such as a diode, a resistor, or an inductor may be further included in the first memory circuit 13 as needed.

The transistors 316, 317, 309, 318, 310, and 311 are connected in series in this order between a wiring 340 to which the potential V2 is applied and a wiring 341 to which the potential V1 is applied. Specifically, one of a source and a drain of the transistor 316 is connected to the wiring 340, and the other is connected to one of a source and a drain of the transistor 317. The other of the source and the drain of the transistor 317 is connected to one of a source and a drain of the transistor 309. The other of the source and the drain of the transistor 309 is connected to one of a source and a drain of the transistor 318. The other of the source and the drain of the transistor 318 is connected to one of a source and a drain of the transistor 310. The other of the source and the drain of the transistor 310 is connected to one of a source and a drain of the transistor 311. The other of the source and the drain of the transistor 311 is connected to the wiring 341.

A gate of the transistor 316 and a gate of the transistor 312 are supplied with the signal RE. A gate of the transistor 311 is supplied with a signal REb which is obtained by inverting the polarity of the potential of the signal RE. A gate of the transistor 317 and a gate of the transistor 309 are supplied with the clock signal CLK. A gate of the transistor 32 is supplied with a signal OS_G.

A gate of the transistor 318 is connected to the other of the source and the drain of the transistor 312, the gate of the transistor 315, and the one electrode of the capacitor 319. The other electrode of the capacitor 319 is connected to the wiring 342 to which the potential V1 is applied.

A gate of the transistor 310 is connected to the other of the source and the drain of the transistor 32 and the one electrode of the capacitor 33, i.e., the node ND. The other electrode of the capacitor 33 is connected to the wiring 343 to which the potential V1 is applied. In operation verification, data D for verification is supplied from the second memory circuit 14 to the node ND.

Note that the wiring 340 may be connected to the wiring 344. In addition, the wiring 341, the wiring 342, and the wiring 343 may be connected to one another.

The one of the source and the drain of the transistor 315 is connected to the wiring 344 to which the potential V2 is applied, one of a source and a drain of the transistor 314, and a gate of the transistor 314. The other of the source and the drain of the transistor 315 is connected to the one of the source and the drain of the transistor 32 and the other of the source and the drain of the transistor 314.

An output terminal of the inverter 305, the input terminal of the transmission gate 304, and the input terminal of the inverter 306 which are included in the sequential circuit 11 are connected to the other of the source and the drain of the transistor 317 and the one of the source and the drain of the transistor 309.

An output terminal of the transmission gate 304, the input terminal of the inverter 307, and an output terminal of the NAND 308 which are included in the sequential circuit 11 are connected to the one of the source and the drain of the transistor 312 included in the first memory circuit 13.

The transistors used for the sequential circuit 11 and the first memory circuit 13 may each include a channel formation region in a semiconductor film of silicon, germanium, or the like in an amorphous, microcrystalline, polycrystalline, or single crystal state. Alternatively, the transistors used for the sequential circuit 11 and the first memory circuit 13 may each include a channel formation region in an oxide semiconductor film.

A transistor having a channel formation region in a film of a semiconductor having a wider band gap and lower intrinsic carrier density than silicon can have a much smaller off-state current than a transistor including a normal semiconductor such as silicon or germanium. Examples of such a semiconductor are an oxide semiconductor and gallium nitride that have a band gap more than twice as wide as that of silicon. Thus, the use of the transistor 32 having the above structure for the first memory circuit 13 can ensure a long data retention time at the node ND in the first memory circuit 13.

An oxide semiconductor film is used in the transistor 32, a silicon film is used in a transistor other than the transistor 32, and the transistor 32 and the capacitor 33 are stacked over the transistor including the silicon film, which leads to reduction in area of the first memory circuit 13.

<Cross-Sectional Structure of Semiconductor Device>

Next, an example of a cross-sectional structure of a semiconductor device of one embodiment of the present invention is described.

Figure 9:
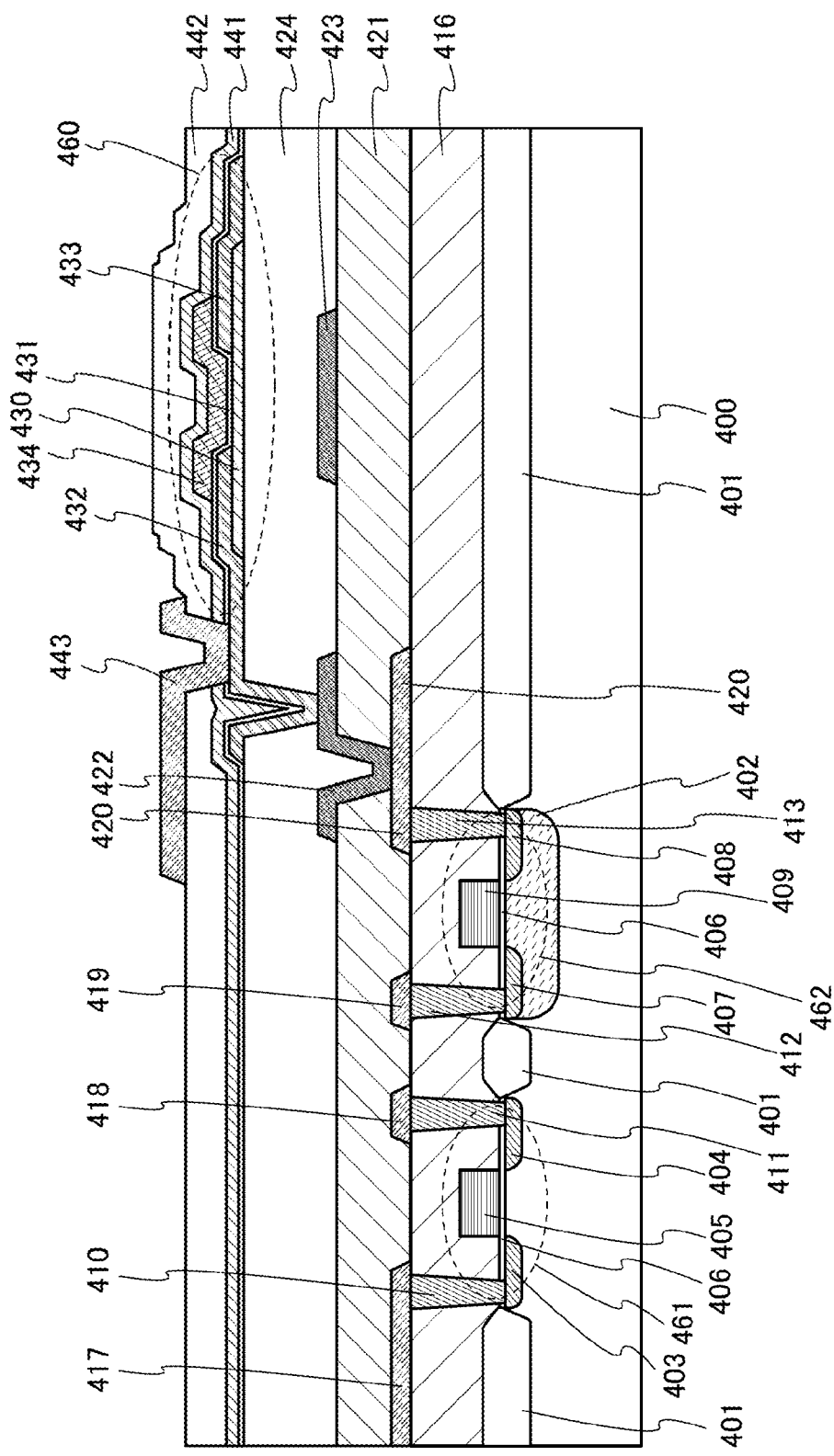
FIG. 9 is a cross-sectional view of a semiconductor device.

FIG. 9 illustrates an example of part of a cross-sectional structure of a semiconductor device of one embodiment of the present invention. In FIG. 9, a transistor 460 having a channel formation region in an oxide semiconductor film and a p-channel transistor 461 and an n-channel transistor 462 each having a channel formation region in a silicon substrate are illustrated.

In this embodiment, described is the case where the p-channel transistor 461 and the n-channel transistor 462 are formed in a single crystal silicon substrate and the transistor 460 using an oxide semiconductor film is formed over the p-channel transistor 461 and the n-channel transistor 462. The p-channel transistor 461 and the n-channel transistor 462 may each include a semiconductor thin film of silicon, germanium, or the like in an amorphous, microcrystalline, polycrystalline, or signal crystal state. Alternatively, the p-channel transistor 461 and the n-channel transistor 462 may each include an oxide semiconductor film. In the case where the transistors each include an oxide semiconductor film, the transistor 460 is not necessarily stacked above the p-channel transistor 461 and the n-channel transistor 462, and the transistor 460, the p-channel transistor 461, and the n-channel transistor 462 may be formed over the same insulating surface.

In the case where the p-channel transistor 461 and the n-channel transistor 462 may each be formed using a silicon thin film, any of the following can be used: amorphous silicon formed by sputtering or vapor phase growth such as plasma-enhanced CVD; polycrystalline silicon obtained by crystallization of amorphous silicon by treatment such as laser annealing; single crystal silicon obtained by separation of a surface portion of a single crystal silicon wafer by implantation of hydrogen ions or the like into the silicon wafer; and the like.

In FIG. 9, the p-channel transistor 461 and the n-channel transistor 462 are formed in a semiconductor substrate 400.

The semiconductor substrate 400 can be, for example, a single crystal silicon substrate having n-type or p-type conductivity, or a compound semiconductor substrate (e.g., a GaAs substrate, an InP substrate, a GaN substrate, a SiC substrate, or a ZnSe substrate). FIG. 9 illustrates an example in which a single crystal silicon substrate having n-type conductivity is used.

The p-channel transistor 461 and the n-channel transistor 462 are electrically isolated by an element isolation insulating film 401. The element isolation insulating film 401 can be formed by a local oxidation of silicon (LOCOS) method, a trench isolation method, or the like.

In a region where the n-channel transistor 462 is formed, a p-well 402 is formed by selective introduction of an impurity element imparting p-type conductivity.

Specifically, the p-channel transistor 461 includes the semiconductor substrate 400, impurity regions 403 and 404 which are formed in the semiconductor substrate 400 and function as a source region and a drain region, a gate electrode 405, and a gate insulating film 406 provided between the semiconductor substrate 400 and the gate electrode 405. The gate electrode 405 overlaps with a channel formation region formed between the impurity regions 403 and 404 with the gate insulating film 406 positioned between the gate electrode 405 and the channel formation region.

Specifically, the n-channel transistor 462 includes the semiconductor substrate 400, impurity regions 407 and 408 which are formed in the semiconductor substrate 400 and function as a source region and a drain region, a gate electrode 409, and the gate insulating film 406 provided between the semiconductor substrate 400 and the gate electrode 409. The gate electrode 409 overlaps with a channel formation region formed between the impurity regions 407 and 408 with the gate insulating film 406 positioned between the gate electrode 409 and the channel formation region.

An insulating film 416 is formed over the p-channel transistor 461 and the n-channel transistor 462. Openings are formed to penetrate the insulating film 416, and a wiring 410, a wiring 411, a wiring 412, and a wiring 413 are formed in the openings to be in contact with the impurity region 403, the impurity region 404, the impurity region 407, and the impurity region 408, respectively.

The wiring 410 is connected to a wiring 417 formed over the insulating film 416. The wiring 411 is connected to a wiring 418 formed over the insulating film 416. The wiring 412 is connected to a wiring 419 formed over the insulating film 416. The wiring 413 is connected to a wiring 420 formed over the insulating film 416.

An insulating film 421 is formed over the wirings 417 to 420. Openings are formed to penetrate the insulating film 421, and a wiring 422 which is connected to the wiring 420 in the opening and a wiring 423 are formed over the insulating film 421. An insulating film 424 is formed over the wirings 422 and 423.

In FIG. 9, the transistor 460 is formed over the insulating film 424.

The transistor 460 includes, over the insulating film 424, a semiconductor film 430 containing an oxide semiconductor, conductive films 432 and 433 that are positioned over the semiconductor film 430 and function as a source electrode and a drain electrode, a gate insulating film 431 over the semiconductor film 430 and the conductive films 432 and 433, and a gate electrode 434 that overlaps with the semiconductor film 430 between the conductive films 432 and 433 with the gate insulating film 431 positioned between the gate electrode 434 and the semiconductor film 430.

The conductive film 432 is connected to the wiring 422 in the opening formed in the insulating film 424.

The wiring 423 is overlapped with the semiconductor film 430 with the insulating film 424 provided therebetween. The wiring 423 functions as a backgate of the transistor 460. Note that the wiring 423 is not necessarily provided.

An insulating film 441 and an insulating film 442 are formed to be stacked in this order over the transistor 460. The insulating film 441 is preferably an insulating film of silicon nitride or the like that can prevent hydrogen released from the insulating film 442 from entering the semiconductor film 430.

An opening is formed in the insulating films 441 and 442 and the gate insulating film 431, and the conductive film 443 that is in contact with the conductive film 432 in the opening is provided over the insulating film 441.

<Semiconductor Film>

Note that a highly purified oxide semiconductor (purified oxide semiconductor) obtained by reduction of impurities such as moisture or hydrogen which serves as electron donors (donors) and by reduction of oxygen vacancies is an intrinsic (i-type) semiconductor or a substantially i-type semiconductor. For this reason, a transistor having a channel formation region in a highly purified oxide semiconductor film has an extremely small off-state current and high reliability.

Specifically, various experiments can prove a small off-state current of a transistor having a channel formation region in a highly purified oxide semiconductor film. For example, even when an element has a channel width of $1 \times 10^6$ μm and a channel length of 10 μm, off-state current can be less than or equal to the measurement limit of a semiconductor parameter analyzer, i.e., less than or equal to $1 \times 10^{-13}$ A, at voltage (drain voltage) between the source electrode and the drain electrode of from 1 V to 10 V. In that case, it can be seen that off-state current normalized on the channel width of the transistor is lower than or equal to 100 zA/μm. In addition, a capacitor and a transistor are connected to each other and the off-state current is measured with a circuit in which charge flowing into or from the capacitor is controlled by the transistor. In the measurement, a highly-purified oxide semiconductor film was used for a channel formation region of the transistor, and the off-state current of the transistor was measured from a change in the amount of charge of the capacitor per unit hour. As a result, it was found that, in the case where the voltage between the source electrode and the drain electrode of the transistor is 3 V, a smaller off-state current of several tens of yA/μm is obtained. Accordingly, the off-state current of the transistor in which the highly purified oxide semiconductor film is used as a channel formation region is much smaller than that of a transistor in which silicon having crystallinity is used.

In the case where an oxide semiconductor film is used as the semiconductor film, at least indium (In) or zinc (Zn) is preferably included as an oxide semiconductor. As a stabilizer for reducing variation in electrical characteristics of a transistor using the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

Among the oxide semiconductors, unlike silicon carbide, gallium nitride, or gallium oxide, an In—Ga—Zn-based oxide, an In—Sn—Zn-based oxide, or the like has an advantage of high mass productivity because a transistor with favorable electrical characteristics can be formed by sputtering or a wet process. Further, unlike silicon carbide, gallium nitride, or gallium oxide, with the use of the In—Ga—Zn-based oxide, a transistor with favorable electrical characteristics can be formed over a glass substrate. Further, a larger substrate can be used.

As another stabilizer, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, any of the following oxides can be used, for example: indium oxide, gallium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Note that, for example, an In—Ga—Zn-based oxide means an oxide containing In, Ga, and Zn and there is no particular limitation on the ratio of In, Ga, and Zn. Further, the In—Ga—Zn-based oxide may contain a metal element other than In, Ga, and Zn. The In—Ga—Zn-based oxide has sufficiently high resistance when no electric field is applied thereto, so that off-state current can be sufficiently reduced. Further, the In—Ga—Zn-based oxide has high mobility.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

For example, with an In—Sn—Zn-based oxide, high mobility can be obtained relatively easily. However, even with an In—Ga—Zn-based oxide, mobility can be increased by reducing the defect density in the bulk.

A structure of the oxide semiconductor film is described below.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when 0 scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where the shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2 θ do not appear at around 36°.

In a transistor using the CAAC-OS film, change in electrical characteristics due to irradiation with visible light or ultraviolet light is small. Thus, the transistor has high reliability.

Note that an oxide semiconductor film may be a stacked film including two or more films of an amorphous oxide semiconductor film, a microcrystalline oxide semiconductor film, and a CAAC-OS film, for example.

<Structure of Chip>

Figure 10A:
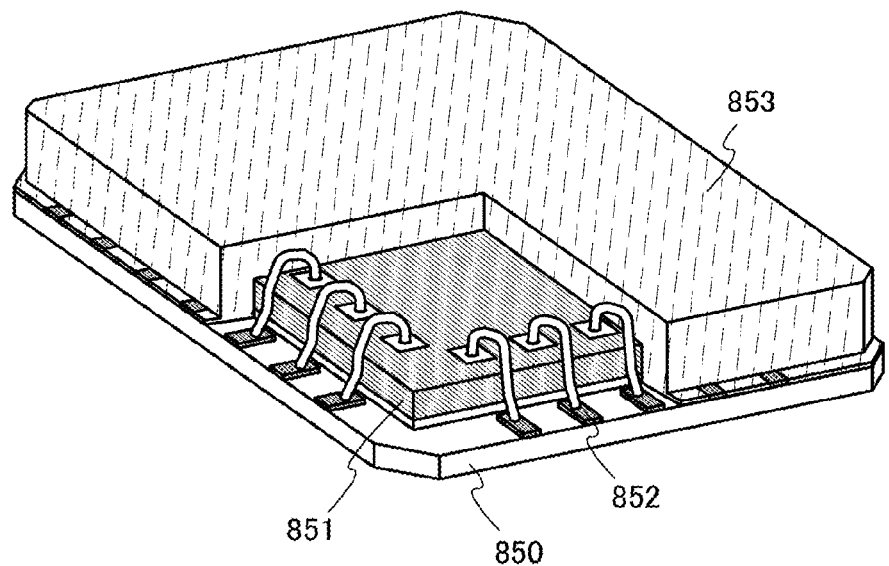
FIGS. 10A and 10B illustrate a chip and a module.

FIG. 10A is a perspective view illustrating a cross-sectional structure of a package using a lead frame interposer.

In the package illustrated in FIG. 10A, a chip 851 corresponding to the semiconductor device of one embodiment of the present invention is connected to a terminal 852 over an interposer 850 by a wire bonding method. The terminal 852 is placed on a surface of the interposer 850 on which the chip 851 is mounted. The chip 851 can be sealed by a mold resin 853 in which case the chip 851 is sealed so that part of each of the terminals 852 is exposed.

Figure 10B:
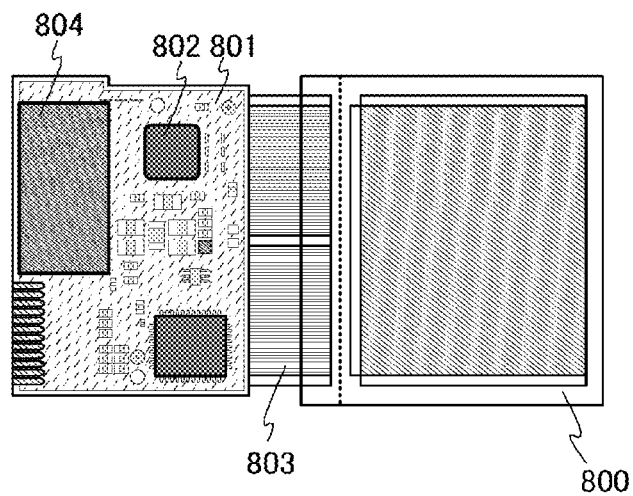

FIG. 10B illustrates the structure of a module of an electronic device in which the package is mounted on a circuit board.

In the module of a mobile phone illustrated in FIG. 10B, a package 802 and a battery 804 are mounted on a printed wiring board 801. In addition, the printed wiring board 801 is mounted on a panel 800 including a display element, by an FPC 803.

(Examples of Electronic Device)

A semiconductor device of one embodiment of the present invention can be used for display devices, personal computers, and image reproducing devices provided with recording media (typically, devices that reproduce the content of recording media such as digital versatile discs (DVDs) and have displays for displaying the reproduced images). Other examples of electronic devices that can include the semiconductor device of one embodiment of the present invention are mobile phones, game consoles including portable game consoles, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. Specific examples of these electronic devices are illustrated in FIGS. 11A to 11F.

Figure 11A:
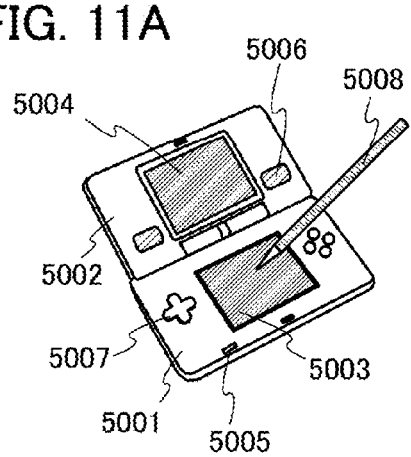
FIGS. 11A to 11F each illustrate an electronic device.

FIG. 11A illustrates a portable game machine, which includes a housing 5001, a housing 5002, a display portion 5003, a display portion 5004, a microphone 5005, speakers 5006, a control key 5007, a stylus 5008, and the like. Note that although the portable game machine in FIG. 11A has the two display portions 5003 and 5004, the number of display portions included in the portable game machine is not limited thereto.

Figure 11B:
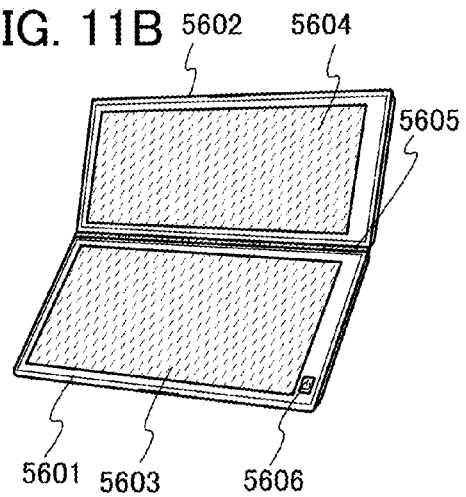

FIG. 11B illustrates a personal digital assistant, which includes a first housing 5601, a second housing 5602, a first display portion 5603, a second display portion 5604, a joint 5605, an operation key 5606, and the like. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. An image displayed on the first display portion 5603 may be switched depending on the angle between the first housing 5601 and the second housing 5602 at the joint 5605. A display device with a position input function may be used as at least one of the first display portion 5603 and the second display portion 5604. Note that the position input function can be added by providing a touch panel in a display device. Alternatively, the position input function can be added by provision of a photoelectric conversion element called a photosensor in a pixel portion of a display device.

Figure 11C:
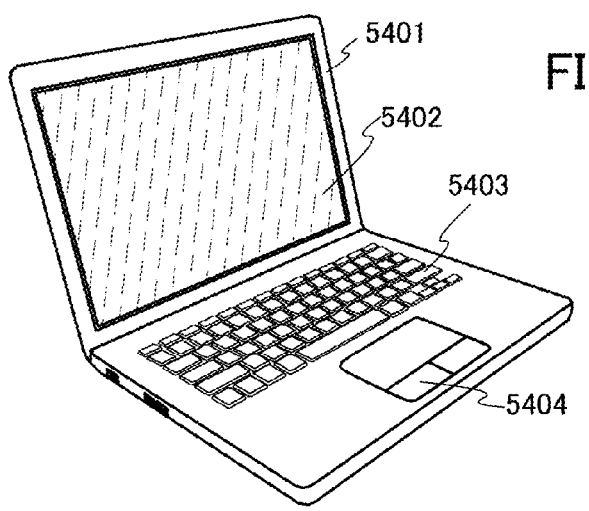

FIG. 11C illustrates a laptop personal computer, which includes a housing 5401, a display portion 5402, a keyboard 5403, a pointing device 5404, and the like.

Figure 11D:
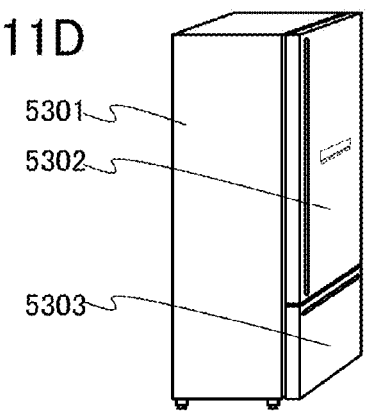

FIG. 11D illustrates an electric refrigerator-freezer including a housing 5301, a door for a refrigerator 5302, a door for a freezer 5303, and the like.

Figure 11E:
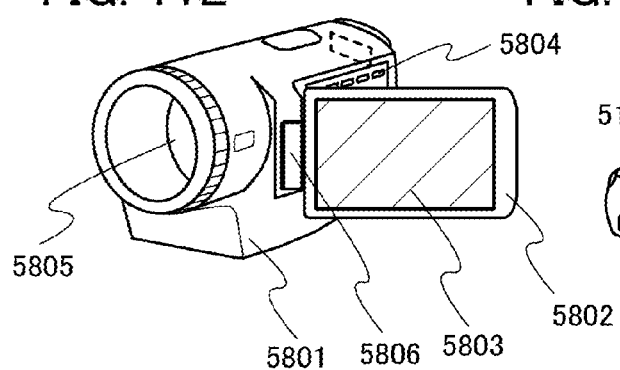

FIG. 11E illustrates a video camera, which includes a first housing 5801, a second housing 5802, a display portion 5803, operation keys 5804, a lens 5805, a joint 5806, and the like. The operation keys 5804 and the lens 5805 are provided for the first housing 5801, and the display portion 5803 is provided for the second housing 5802. The first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle between the first housing 5801 and the second housing 5802 at the joint 5806.

Figure 11F:
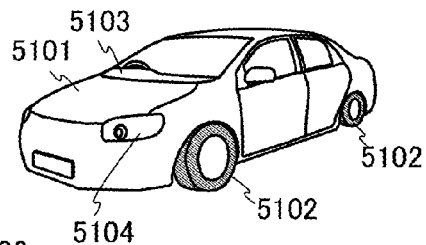

FIG. 11F illustrates a motor vehicle, which includes a car body 5101, wheels 5102, a dashboard 5103, lights 5104, and the like.

This application is based on Japanese Patent Application serial no. 2013-051426 filed with Japan Patent Office on Mar. 14, 2013, the entire contents of which are hereby incorporated by reference.

What is claimed is:

1. A semiconductor device comprising:
    a combinational circuit configured to generate second data based on first data;
    a first sequential circuit configured to hold the first data supplied to the combinational circuit;
    a second sequential circuit configured to hold the second data supplied from the combinational circuit;
    a first memory circuit configured to hold the first data supplied from the first sequential circuit; and
    a second memory circuit configured to hold the second data supplied from the second sequential circuit,
    wherein the semiconductor device comprises a path configured to forward the first data held in the first sequential circuit from the first sequential circuit to the second sequential circuit through the first memory circuit and the second memory circuit and not through the combinational circuit.

2. The semiconductor device according to claim 1,
    wherein the first memory circuit comprises:
        a first node; and
        a first transistor configured to control supply of the first data from the first sequential circuit to the first node, and
    wherein the second memory circuit comprises:
        a second node; and
        a second transistor configured to control supply of the second data from the second sequential circuit to the second node.

3. The semiconductor device according to claim 2,
    wherein a channel formation region of the first transistor is included in a first oxide semiconductor film, and
    wherein a channel formation region of the second transistor is included in a second oxide semiconductor film.

4. The semiconductor device according to claim 3,
    wherein the combinational circuit, the first sequential circuit, or the second sequential circuit comprises a third transistor,
    wherein a channel formation region of the third transistor is included in a silicon substrate, and
    wherein the first transistor and the second transistor are provided over the third transistor.

5. The semiconductor device according to claim 1, comprising a first path and a second path each electrically connecting the first sequential circuit to the first memory circuit.

6. A semiconductor device comprising:
    a combinational circuit configured to generate second data based on first data;
    a first sequential circuit configured to hold the first data supplied to the combinational circuit;
    a second sequential circuit configured to hold the second data supplied from the combinational circuit;
    a first memory circuit configured to hold the first data supplied from the first sequential circuit;
    a second memory circuit configured to hold the second data supplied from the second sequential circuit; and
    a relay memory circuit between the first memory circuit and the second memory circuit,
    wherein the semiconductor device comprises a path configured to forward the first data held in the first sequential circuit from the first sequential circuit to the second sequential circuit through the first memory circuit and the second memory circuit and not through the combinational circuit.

7. The semiconductor device according to claim 6,
    wherein the first memory circuit comprises:
        a first node; and
        a first transistor configured to control supply of the first data from the first sequential circuit to the first node, and
    wherein the second memory circuit comprises:
        a second node; and
        a second transistor configured to control supply of the second data from the second sequential circuit to the second node.

8. The semiconductor device according to claim 7,
    wherein a channel formation region of the first transistor is included in a first oxide semiconductor film, and
    wherein a channel formation region of the second transistor is included in a second oxide semiconductor film.

9. The semiconductor device according to claim 8,
    wherein the combinational circuit, the first sequential circuit, or the second sequential circuit comprises a third transistor,
    wherein a channel formation region of the third transistor is included in a silicon substrate, and
    wherein the first transistor and the second transistor are provided over the third transistor.

10. The semiconductor device according to claim 6,
    wherein the relay memory circuit includes:
        a relay node;
        a first logic gate configured to output the first data supplied from the first memory circuit;
        a first switch configured to control supply of the first data from the first logic gate to the relay node;
        a second logic gate configured to output the first data from the relay node; and
        a second switch controlling configured to output supply of the first data from the second logic gate to the second memory circuit.

11. The semiconductor device according to claim 10,
wherein the first switch is configured to be turned on when the second switch is turned off, and
wherein the first switch is configured to be turned off when the second switch is turned on.

12. The semiconductor device according to claim 6, comprising a first path and a second path each electrically connecting the first sequential circuit to the first memory circuit.

13. A semiconductor device comprising:
a combinational circuit;
a first sequential circuit configured to hold first data supplied to the combinational circuit;
a second sequential circuit configured to hold second data supplied from the combinational circuit;
a first memory circuit configured to hold the first data supplied from the first sequential circuit;
a second memory circuit configured to hold the second data supplied from the second sequential circuit; and
a relay memory circuit between the first memory circuit and the second memory circuit,
wherein the relay memory circuit comprises:
a relay node;
a first logic gate configured to output the first data supplied from the first memory circuit;
a first transistor configured to control supply of the first data from the first logic gate to the relay node;
a second logic gate configured to output the first data supplied from the relay node; and
a second transistor configured to control supply of the first data from the second logic gate to the second memory circuit,
wherein a channel formation region of the first transistor is included in a first oxide semiconductor film,
wherein a channel formation region of the second transistor is included in a second oxide semiconductor film, and
wherein the semiconductor device comprises a path configured to forward the first data held in the first sequential circuit from the first sequential circuit to the second sequential circuit through the first memory circuit and the second memory circuit and not through the combinational circuit.

14. The semiconductor device according to claim 13,
wherein the first memory circuit comprises:
a first node; and
a third transistor configured to control supply of the first data from the first sequential circuit to the first node, and
wherein the second memory circuit comprises:
a second node; and
a fourth transistor configured to control supply of the second data from the second sequential circuit to the second node.

15. The semiconductor device according to claim 14,
wherein a channel formation region of the third transistor is included in a third oxide semiconductor film, and
wherein a channel formation region of the fourth transistor is included in a fourth oxide semiconductor film.

16. The semiconductor device according to claim 15,
wherein the combinational circuit, the first sequential circuit, or the second sequential circuit comprises a fifth transistor,
wherein a channel formation region of the third transistor is included in a silicon substrate, and
wherein the first transistor, the second transistor, the third transistor, and the fourth transistor are provided over the fifth transistor.

17. The semiconductor device according to claim 13,
wherein the first transistor is configured to be turned on when the second transistor is turned off, and
wherein the first transistor is configured to be turned off when the second transistor is turned on.

18. The semiconductor device according to claim 13, comprising a first path and a second path each electrically connecting the first sequential circuit to the first memory circuit.

* * * * *